United States Patent [19]
Greer

[11] Patent Number: 5,345,134
[45] Date of Patent: Sep. 6, 1994

[54] SAW DEVICE AND METHOD OF MANUFACTURE

[75] Inventor: James A. Greer, Andover, Mass.

[73] Assignee: Raytheon Company, Lexington, Mass.

[21] Appl. No.: 221,495

[22] Filed: Jun. 29, 1988

[51] Int. Cl.⁵ .............................................. H01L 41/08
[52] U.S. Cl. ................................................ 310/313 D
[58] Field of Search ............ 310/313 R, 313 C, 313 D

[56] References Cited

U.S. PATENT DOCUMENTS

| | | | |
|---|---|---|---|
| 4,012,650 | 3/1977 | Pratt et al. | 310/313 C |
| 4,155,057 | 5/1979 | Sandy et al. | 310/313 D |
| 4,243,960 | 1/1981 | White et al. | 310/313 R |
| 4,401,956 | 8/1983 | Joshi | 310/313 D |
| 4,477,892 | 10/1984 | Tosima et al. | 310/313 R |
| 4,870,313 | 9/1989 | Hirama et al. | 310/313 R |

Primary Examiner—Peter A. Nelson
Attorney, Agent, or Firm—Richard M. Sharkansky

[57] ABSTRACT

A SAW device such as a resonator includes a surface supporting surface wave propagation and a pair of aluminum transducer elements each coupled to said surface wave propagation surface. Each aluminum transducer element is doped with a predetermined amount of silicon. Frequency shifts which result from exposing the SAW device to high temperature cycles as often encountered when packaging the device are reduced, since the silicon present as a dopant in the aluminum will provide an effect on frequency which can be taken into consideration during design and fabrication. These frequency effects will dominate any frequency effects which may result from silicon migration from the substrate to the transducers as a result of the thermal cycling encountered during sealing of the SAW device.

12 Claims, 8 Drawing Sheets

SAW DEVICE AND METHOD OF MANUFACTURE

BACKGROUND OF THE INVENTION

This invention relates generally to surface acoustic wave devices (SAW) and more particularly to a SAW device having improved frequency stability.

As is known in the art, surface acoustic wave devices are used in a variety of applications. In one such application, a surface acoustic device such as a SAW resonator is used in a feedback circuit of an amplifier to provide a frequency stabilized oscillator. It is also known in the art that SAW devices are commonly packaged to isolate the surface acoustic wave device from an external environment. Generally, during packaging of SAW devices, the process of sealing the SAW device packages induces frequency shifts, as well as, variations or uncertainties in frequency shift from the initial or design frequency of the SAW device. For applications such as high precision, SAW resonator stabilized oscillators, frequency shifts of the order induced during sealing are often unacceptable. A further problem, however, is the uncertainty in the frequency shift on sealing. A large uncertainty in frequency shift makes compensation for such frequency shift more difficult, since this uncertainty prevents a designer from compensating for the frequency shift by designing the device for a lower or higher frequency and thus taking into consideration the post seal frequency shift.

SUMMARY OF THE INVENTION

It is believed that one major cause of post seal frequency shift is the migration of substrate material into the material of the transducers which changes the mechanical characteristics (i.e. modulus of elasticity) of the transducer and hence the frequency characteristics of the SAW device.

In accordance with the present invention, a SAW device includes a substrate comprising a piezoelectric material which supports surface wave propagation, said material comprising a piezoelectric ceramic such as one having the general formula: $A_xB_{l-x}O$ where O is oxygen and A and B are metals and x is the compositional ratio of A to O. The device further includes transducer means disposed on said substrate and coupled to said surface wave propagation surface with said transducer means being comprised of a conductive material which is doped with a predetermined concentration of at least one of A and B having a concentration of at least about 0.5%. With this arrangement, by providing the transducer means comprised of a conductive material doped with a predetermined concentration of at least one of A and B, any migration the one of A or B from the substrate into the conductive material of the transducers will be compensated for since the introduction one of A and B as a dopant will reduce the effects of migration of A and B on the mechanical characteristics of the transducers and concomitantly on the frequency characteristics of the SAW device. That is, since the pre-seal frequency is obtained with a transducer means comprised of a doped, conductive material, the further addition of A or B due to high temperature sealing cycles in particular will have a significantly less effect on the post-seal frequency of the SAW device.

In accordance with a further aspect of the present invention, the SAW device includes a substrate comprised of an ST-cut of quartz having a surface which supports surface wave propagation, and a pair of transducers, each transducer disposed on said surface wave propagation surface, and each transducer comprised of a conductive material doped with silicon to a concentration of doped silicon of at least about 0.3%, preferrably in the range of about 0.5% to 1.0% with 0.5% being a preferred, typical value. With such an arrangement, by doping the conductive electrodes of the transducers with silicon, any silicon which migrates from the quartz substrate into the transducers will have a significantly less effect on the mechanical characteristics of the transducers and hence, the frequency characteristics of the SAW device. The SAW device can thus be designed to take into consideration the effect of the Si dopant on SAW device frequency. The concentration of silicon due to silicon migration is believed to be substantially less (by a factor of typically three) than the concentration due to doping, and thus, the major effect on frequency shifts caused by the presence of silicon in the transducers may be effectively compensated for during design and fabrication of the SAW device prior to sealing. That is, any silicon which may result from migration would be relatively small in comparison to the amount of silicon present because of doping and concomitantly the effects on frequency shift due to silicon migration are reduced.

In accordance with a further aspect of the present invention, a method of reducing the magnitude of frequency shift and uncertainty or variation in frequency shift of a SAW device subsequent to packaging of the SAW device in a sealed enclosure exposed to a high temperature cycle comprises the steps of providing a substrate comprised of quartz or in particular an ST-cut of quartz having a surface which supports surface wave propagation, and forming a pair of transducers over said surface wave propagation surface, said transducers being formed by providing a conductive metal doped with silicon in the range of 0.3% to 1.0%. With this method, the amount of silicon in the transducers resulting from migration would be substantially less than the concentration of silicon provided by doping. Accordingly, the magnitude of the frequency shift, as well as, the magnitude of the uncertainty in frequency shift in the SAW device after sealing are reduced.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1B:
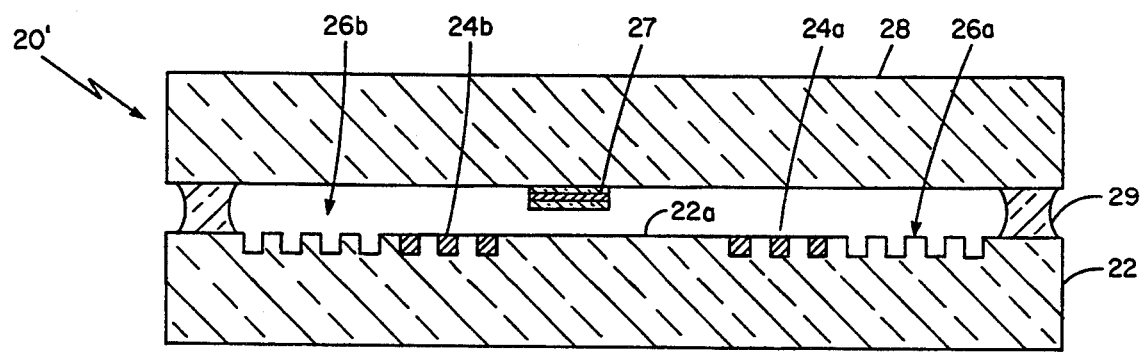
FIG. 1B is a cross-sectional view taken along line 1B—1B of FIG. 1A.

Referring now to FIG. 1, a packaged surface acoustic wave device, here a resonator 20' is shown to include a a resonator 21 provided on a substrate 22 comprised of a piezoelectric material here ST or a rotated ST-cut of quartz although other cuts of quartz, as well as, other materials such as lithium niobate and gallium arsenide may alternatively be used. Resonator 21 includes a pair of transducers 24a, 24b disposed on a first surface 22a of substrate 22. Resonator 21 also includes a pair of reflecting gratings 26a, 26b here disposed in surface 22a and disposed to confine surface wave propagation generally between said pair of transducers 24a, 24b as is generally known. Resonator 21 is enclosed by a cover 28 having a trim pad 27 disposed on an inner surface thereof as shown. The cover is attached to the substrate by a sealant material 29 as will be further described in conjunction with FIGS. 4A–4E.

Referring now to FIGS. 2A–2E, a preferred sequence of steps used in forming the transducers and reflecting gratings over surface 22a of the substrate 22 will now be described.

Figure 2A:
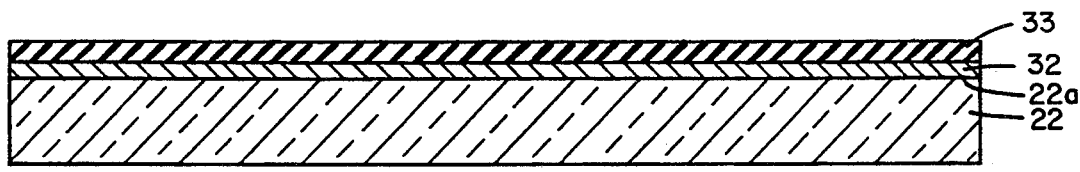
FIGS. 2A–2E are a series of cross-sectional views showing a preferred sequence of steps for forming transducers over a substrate in accordance with the present invention.

Referring first to FIG. 2A, the substrate 22 has surface 22a which is polished and thus prepared to support surface wave propagation. Over surface 22a is disposed a protective material such as vanadium 32 or other materials such as polyimide or silicon nitride. The purpose of this layer is to protect surface 22a from scratches and from chemical attack by agents used in the processing of surface 22a and also to provide an adherent material for a layer of photoresist 33 as shown. In addition to providing adhesion for the photoresist layer 33, the vanadium layer 32 is also provided to facilitate a subsequent lift-off of the photoresist layer 33, as will be described. Here the vanadium 32 layer has a thickness of approximately 1000 Å and is deposited in a vacuum by well-known techniques such as e-beam evaporation.

Figure 2B:
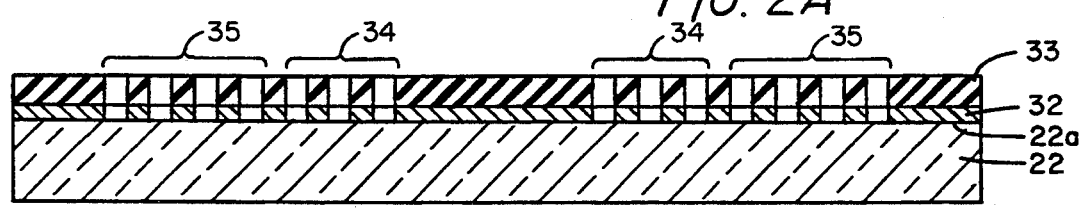

Referring now to FIG. 2B, the photoresist layer 33 is exposed to light via a mask (not shown), and the exposed photoresist material is developed and washed away with a developer as is also well known. The removal of the photoresist exposes selected underlying portions of the vanadium layer 32 and provides a desired electrode pattern 34 for the transducers 24a, 24b, as well as, patterns 35 for reflecting gratings 26a, 26b. The exposed portions of the vanadium layer 32 are also removed in these regions by a plasma etching in which a reactive gas such as a mixture of carbon tetrafluoride and oxygen is applied to the vanadium layer 32 under very low vacuum pressures. By means of electrical discharge, the gas becomes reactive within the vacuum chamber causing the gas to give off free radicals which attack the exposed vanadium layer but which are unreactive with the photoresist. This transfers the pattern which was created in the photoresist layer 33 to the vanadium layer 32 and thus, exposes underlying portions of substrate 22.

Figure 1A:
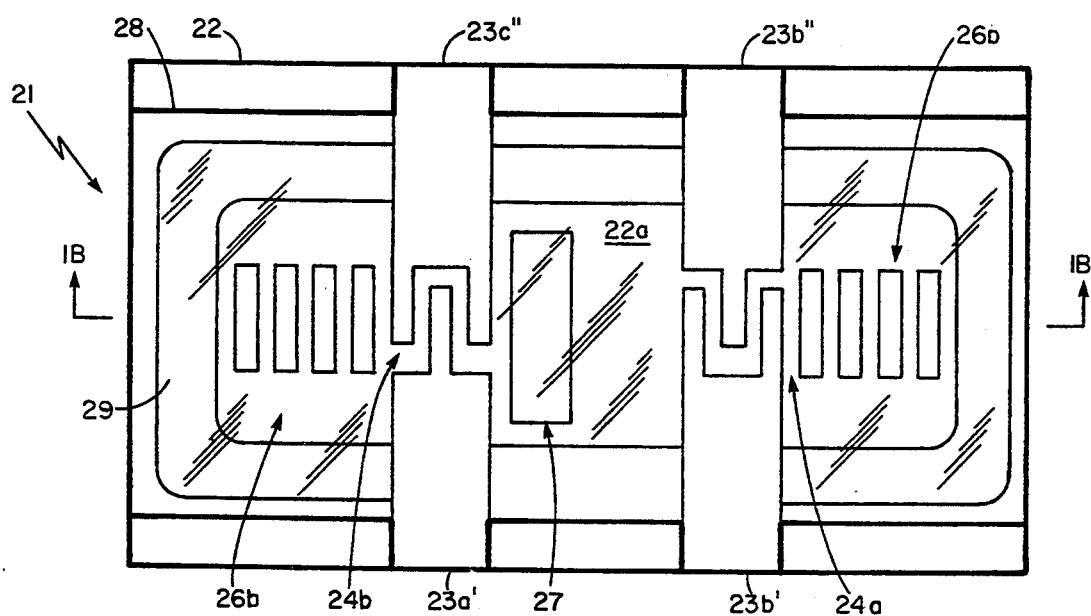
FIG. 1A is a plan view of a SAW device having a cover disposed to enclose a surface wave propagation surface and a pair of interdigitated transducers.
Figure 2C:
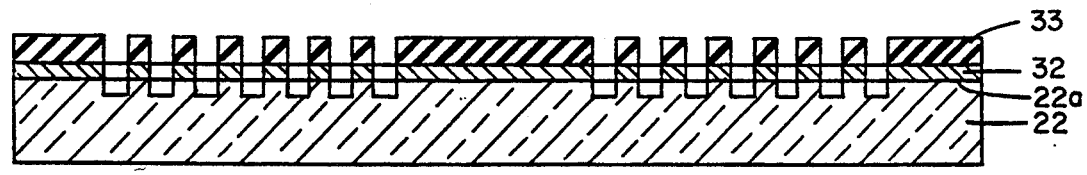

Referring now to FIG. 2C, here the substrate 22 is etched to a depth of about 1,000 Å by ion beam milling. Activated argon ions are used to physically erode away the quartz in the exposed regions thereof, defined by the pattern in the vanadium and photoresist layers. Accordingly, this etching step provides recesses for the reflecting gratings 26a, 26b (FIG. 1) and recessed patterns for the transducers 24a, 24b (FIG. 1) which will now be fabricated in conjunction with FIG. 2D.

Figure 2D:
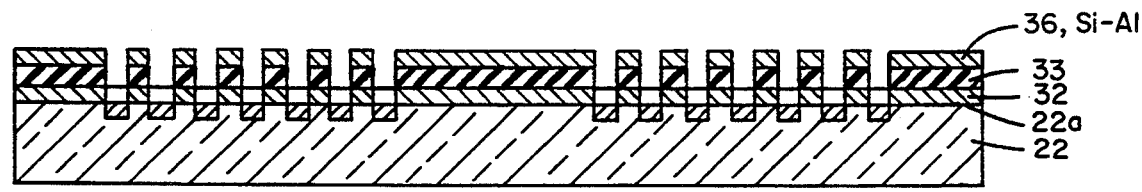

Referring now to FIG. 2D, a layer 36 of conductive material here aluminum which is doped with silicon to provide silicon in a concentration of about 0.3% to 1.0% as deposited onto exposed portions of the quartz substrate 22, is deposited within the pattern provided in the vanadium and photoresist layer and over the photoresist layer 33.

Any one of a number of techniques may be used to deposit the silicon and the aluminum. For example, the silicon and aluminum may be deposited by an electron beam evaporation from a bulk silicon doped aluminum source.

In order to provide the transducer with a Si-Al composition as mentioned above, it is required to have a source of Si and Al which is relatively rich in Si, when using an evaporation technique. Since evaporation takes place under a vacuum condition with the sources of the material to be deposited heated to some predetermined temperature, the relative vapor pressure of both Si and Al must be taken into consideration. Si has a lower vapor pressure than Al, hence the need for a source of Si-Al relatively rich in Si. Here a bulk source of about 17% Si, 83% Al was used.

Figure 3A:
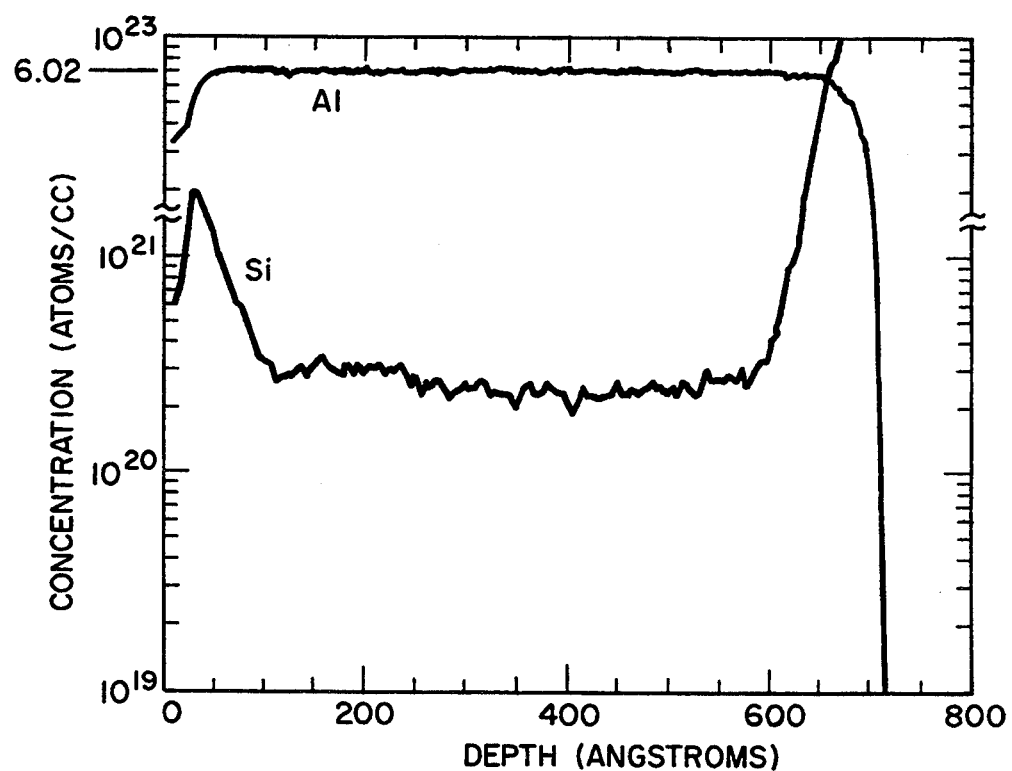
FIGS. 3A and 3B are plots of SIMS data showing concentration of Si and Al as a function of depth for transducers subjected to a high temperature annealing cycle.

As shown in FIG. 3A, the composition of the transducers provided by depositing Si doped Al and heating to a temperature of about 400° C. to simulate a sealing cycle was about 0.5% Si and 99.5 Al.

Generally, the composition of Si to Al in the evaporation source may be adjusted to thus adjust the composition of Si to Al as deposited for the transducers.

Figure 3B:
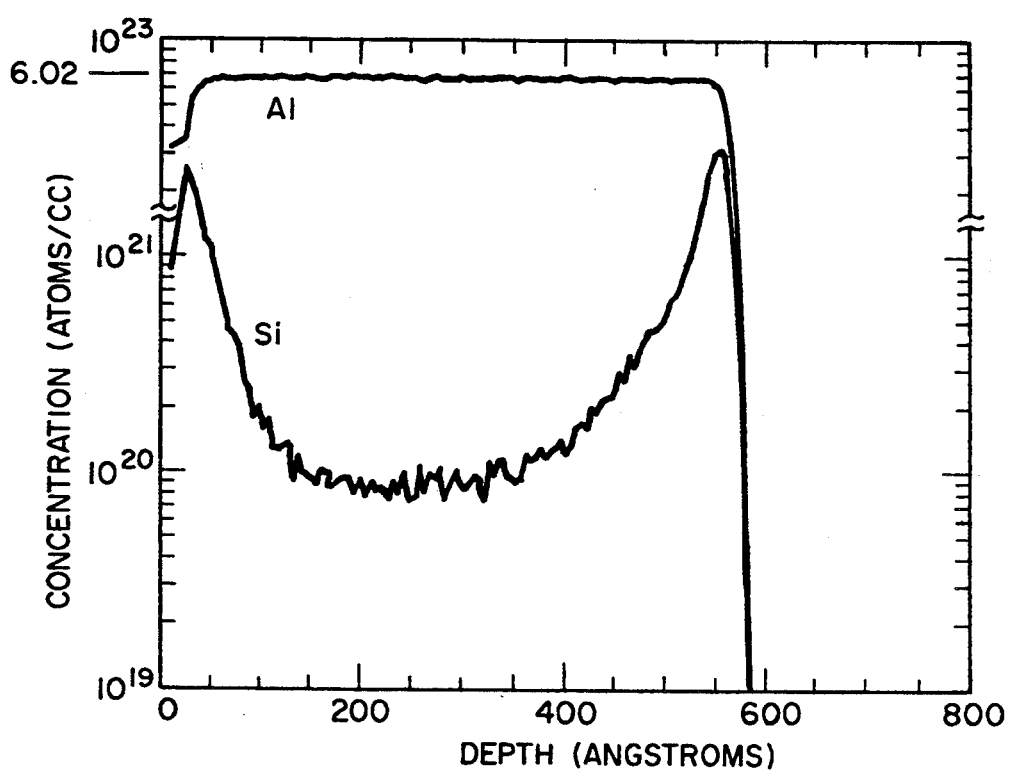

As shown in FIG. 3B, the composition after subjecting to a heating cycle of about 400° C. for a transducer conventionally fabricated by depositing pure Al indicates a concentrated Si of about $1 \times 10^{20}$ a/cc which corresponds to a percentage composition of about 0.16% Si.

Thus, Si dopant is preferrable added to increase the amount of Si by about a factor of about three (3) over that which will be present after subjected the SAW device to a heat treatment. It is also believed that for practical temperature cycles (i.e. below the crystallographic transformation temperature of quartz for example) the concentration of Si due to migration after heat treatment will be generally less than 0.2%.

Alternatively, the material may be deposited by a co-evaporation from a source of silicon and a source of aluminum, or the material may be deposited by sputtering from a composite source of silicon doped aluminum or from individual targets of silicon and aluminum.

In any event, the silicon doped aluminum is deposited within the grooves 34 and 35 disposed in substrate 22. The aluminum deposited in grooves 35 provides the desired configuration for electrode fingers and pads 23a; 23a', 23b', 23b' for transducers 24a and 24b. The aluminum deposited within the recesses or grooves 34 of reflecting gratings is here removed by a subsequent masking and etching process, as will be described in conjunction with FIG. 2E.

Figure 2E:
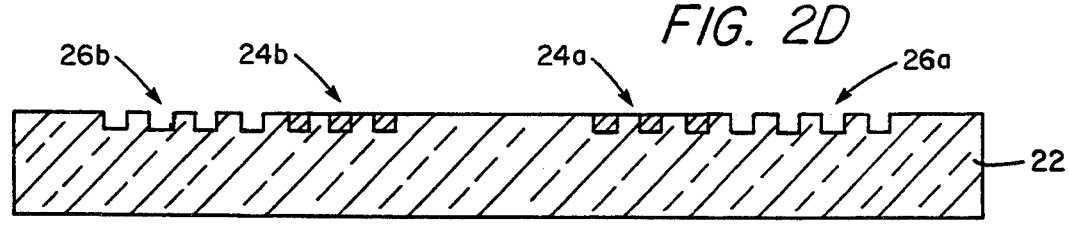

Referring now to FIG. 2E, subsequent to formation of the transducers 24a and 24b, the photoresist 33 is removed by dissolving the material in a suitable solvent for the particular photoresist type selected. A second layer of photoresist (not shown) is then provided over the substrate and is patterned to expose the regions in which the reflecting gratings were provided and is used to mask the regions where the transducer elements were formed. The silicon doped aluminum deposited within the gratings 26a and 26b is removed by a suitable etchant as is generally known.

After the metal is removed from the gratings 26a, 26b, the aforementioned plasma etching technique is then used to remove the remaining portions of vanadium layer 32. Surface 22a may then be cleaned with a suitable cleaning agent such as carbon tetrafluoromethane.

Generally, at this juncture, the SAW resonator is subjected to a number of heating cycles to seal the SAW resonator within a package. A preferred package for this device is an all-quartz package which has a cover which is comprised of a material which is crystallographically matched to the material of the substrate. Preferably, disposed on an inner surface of said cover is a pad comprising a tri-layer of material such as aluminum oxide, aluminum, and aluminum oxide which may be used to trim the frequency characteristics of the post-sealed SAW device, as described in my copending U.S. patent application Ser. No. 944,911 filed Dec. 22, 1986 and assigned to the assignee of the present invention.

Figure 4A:
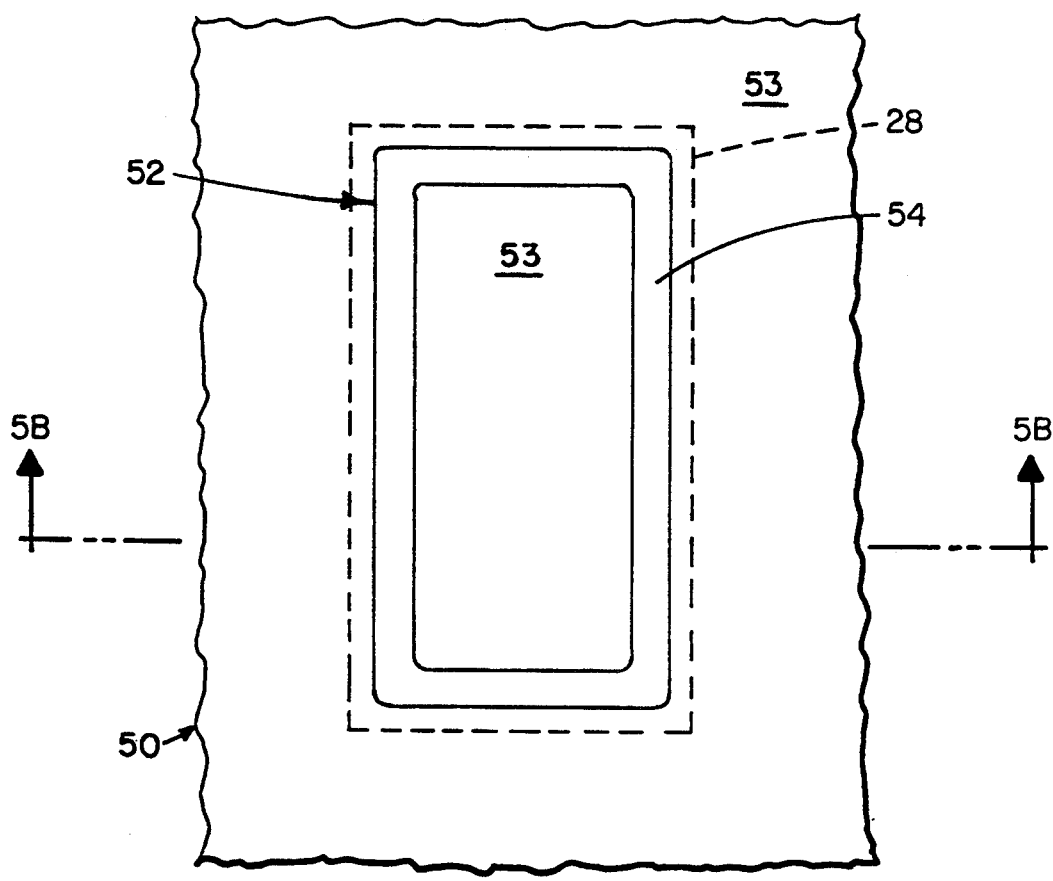
FIG. 4A is a plan view of a cover portion for a package for the SAW devices of FIG. 2 having on a first surface thereof a patterned glass frit sealant material.
Figure 4B:
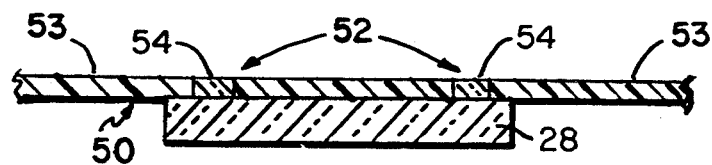
FIG. 4B is a cross-sectional view of the cover shown in FIG. 5A, taken along lines 5B—5B of FIG. 5A.
Figure 4C:
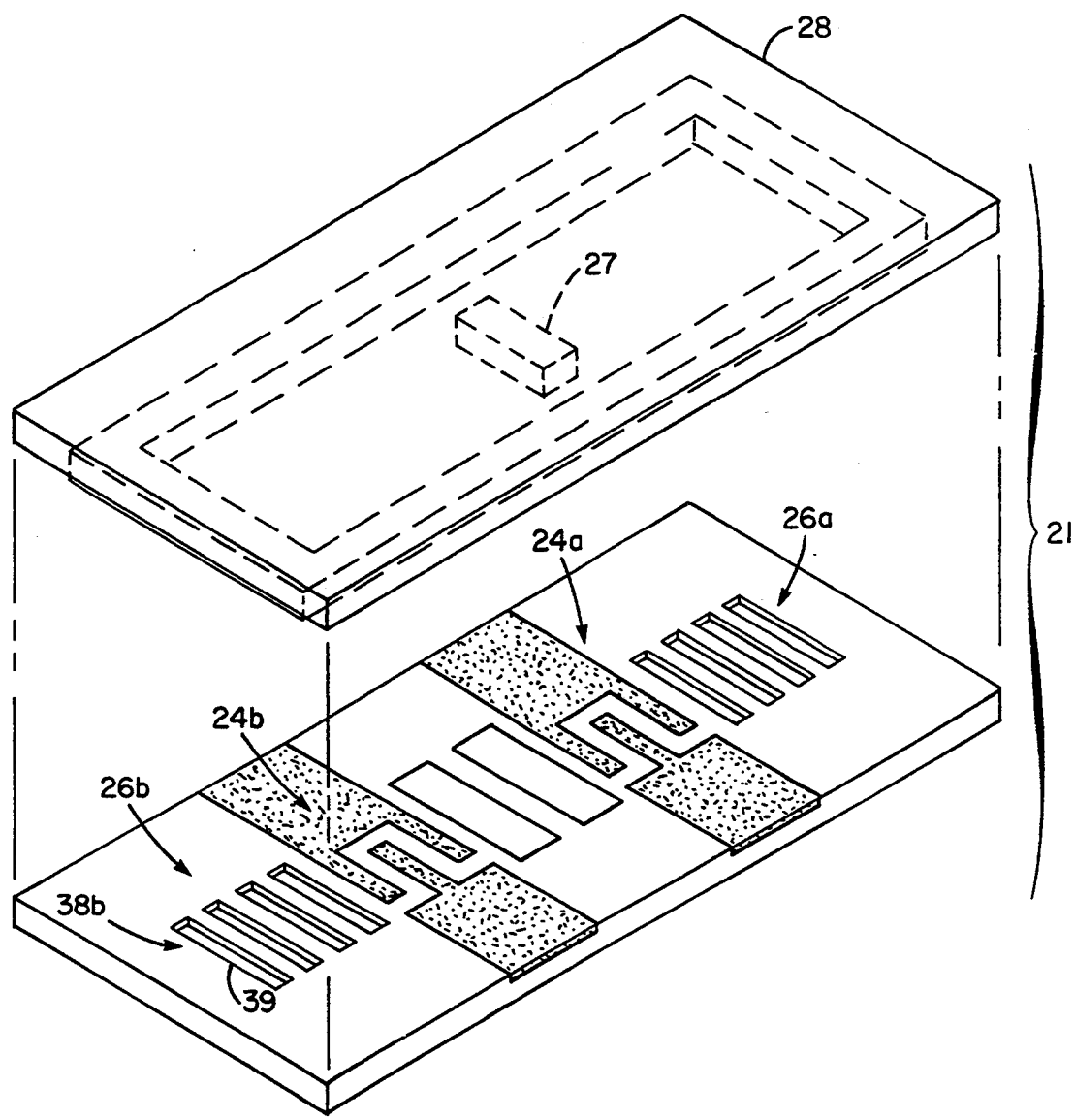
FIG. 4C is an exploded isometric view of a composite SAW resonator having a base with a pair of devices disposed over opposite surfaces thereof and a pair of covers disposed to enclose the pair of SAW devices.
Figure 5:
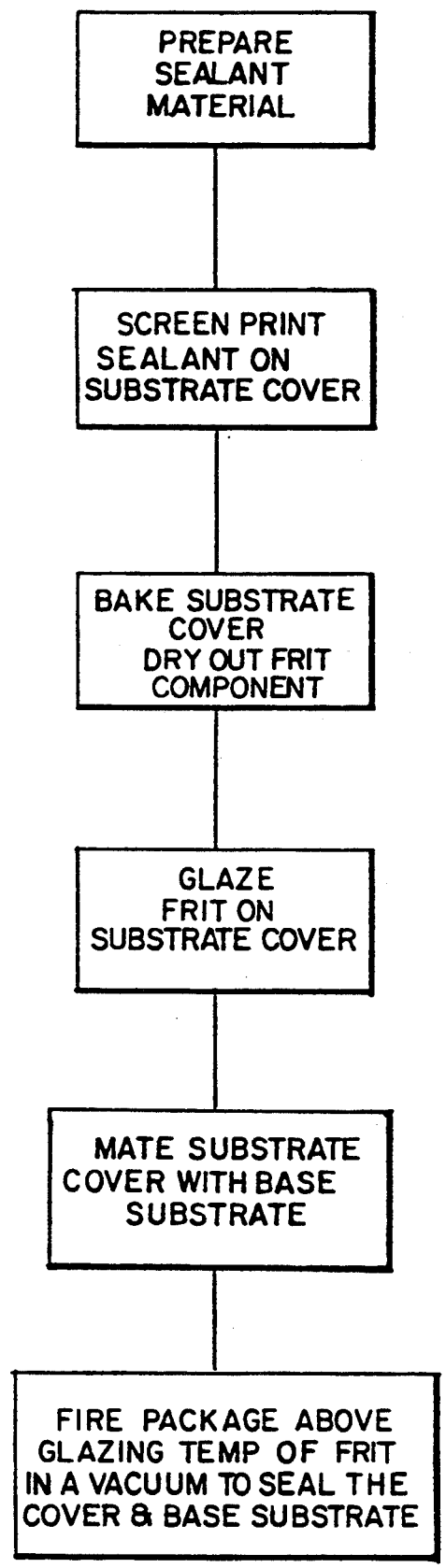
FIG. 5 is a flow chart showing the preferred steps in providing the quartz covers sealed to the quartz base in accordance with a preferred embodiment of the invention.

Referring now to FIGS. 4A, 4B through 7A, 7B, a preferred sequence of steps, as summarized in the flow chart of FIG. 5, to provide a cover which encloses the resonator device 21 will now be described.

Referring first to FIG. 4C, the packaged SAW resonator 20' is shown to include a substrate cover 28, base substrate 22 having the resonator 21 and a glass frit seal 29 disposed between the base 22 and cover 28.

Referring now to FIGS. 4A, 4B, a substrate cover 28, here comprised of ST-cut quartz, is shown to include a screen printed pattern 52 having disposed therein a sealant material 54, here said sealant material 54 being comprised of a mixture of a glass frit powder and an organic binder vehicle. Said screen printed pattern 52 and sealant material 54 are provided in a manner to be described.

Here the glass frit used is a high lead oxide content glass frit. Examples of two of such frits suitable for use with ST-cut quartz are Corning Glass Works, Corning, N.Y., No. 8463 vitrifying frit, and Corning No. 7572 devitrifying frit, hereinafter referred to as "8463" and "7572," respectively. However, any suitable glass frit having a thermal expansion coefficient substantially matched to the thermal expansion coefficient of the selected material of the substrate cover and base member and having a firing temperature below the crystallographic transformation temperature of the material of the substrate may also be used. The organic binder vehicle here used is a mixture of 60 ml butyl carbitol acetate, 40 ml butyl carbitol and 3 g of an acrylic resin, more particularly, an isobutyl methyl methacrylate resin, here obtained from Dupont Company, Special Products Division, Methyl Methacrylate Products Group, Wilmington, Del. under the tradename Elvacite "2045." Amyl acetate alone was tried as an organic binder vehicle. However, amyl acetate dried too quickly and the results were less acceptable. Thus, it was found that the best results were obtained using a binder vehicle which dried relatively slowly allowing sufficient time for the glass frit material to flow prior to the organic vehicle being driven off.

As was previously mentioned above, the sealant material 54 is screen printed onto here the substrate cover 28. The sealant material 54 is screen printed as follows: A fine mesh stainless steel screen 50 is provided with an emulsion film layer 53 in a conventional manner. The pattern 52, here in the form of a rectangular ring pattern, is projected on the emulsion film 50. The area of the ring pattern 52 is exposed while the remaining portion of the layer 53 is unexposed. The exposed portion of layer 53 is developed and then dissolved away while the unexposed portion of layer 53 remains in situ on the screen 50, thus providing the patterned area 52. The patterned screen 50 is then disposed over the substrate cover 28. The sealant material 54 is then provided over the screen 50 and fills the pattern 52. Excess amounts of the sealant material on the screen 50 are removed by any suitable means, such as by use of a "squeegee." Remaining on the substrate 28 in the patterned area 52, however, is the sealant material 54. Preferably, the pattern 52 is provided over a peripheral surface portion of the substrate cover 28 adjacent to the edges of said substrate cover 28, as shown in FIGS. 4A and 4B. The sealant material 54 provides a continuous closed path or ring pattern on the surface of substrate cover 28. The sealant material 54 on the substrate cover 28 is processed in a manner to be described, to provide a glass frit seal 29 between the substrate cover 28 and a base member 22.

Returning to fabrication of cover 28, after the sealant material 54 has been deposited in the unpatterned areas of the fine mesh screen 50, the fine mesh screen 50 is removed from the surface of the substrate cover 28. The substrate cover 28 having thereon the patterned sealant material is then baked in an oven at a temperature substantially below the glazing temperature of the glass frit. Here a temperature of 140° C. is used, said temperature being selected to dry out the sealant material, that is, to drive off from the sealant, the organic binder vehicle component thereof, without glazing the glass frit component. Here the substrate cover 26 is baked at 140° C. in air for approximately 1 hour.

Figure 6A:
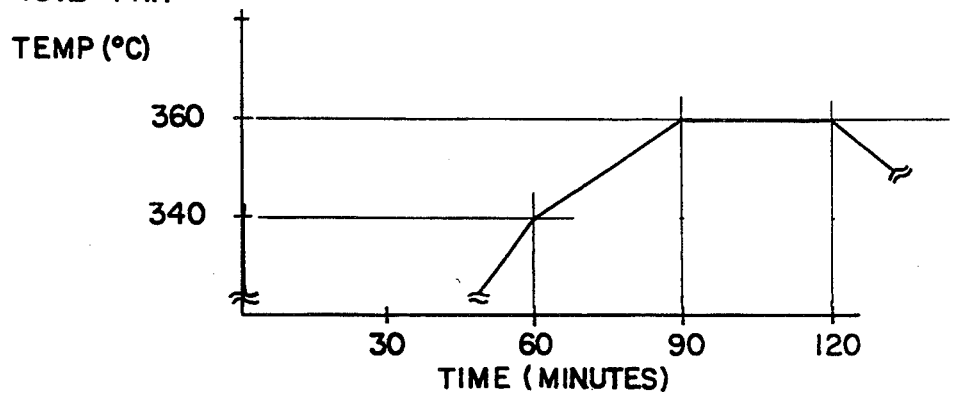
FIGS. 6A–6B are plots of temperature versus time for a heating cycle to glaze and seal the resonator with a devitrifying glass frit.
Figure 7A:
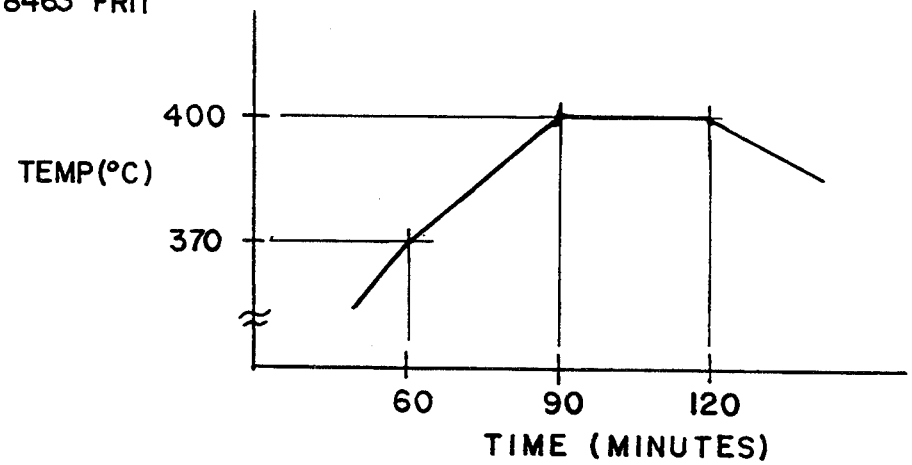
FIGS. 7A–7B are graphs of temperature versus time for a heating cycle to glaze and seal the resonator with a vitrifying glass frit.
Figure 7B:
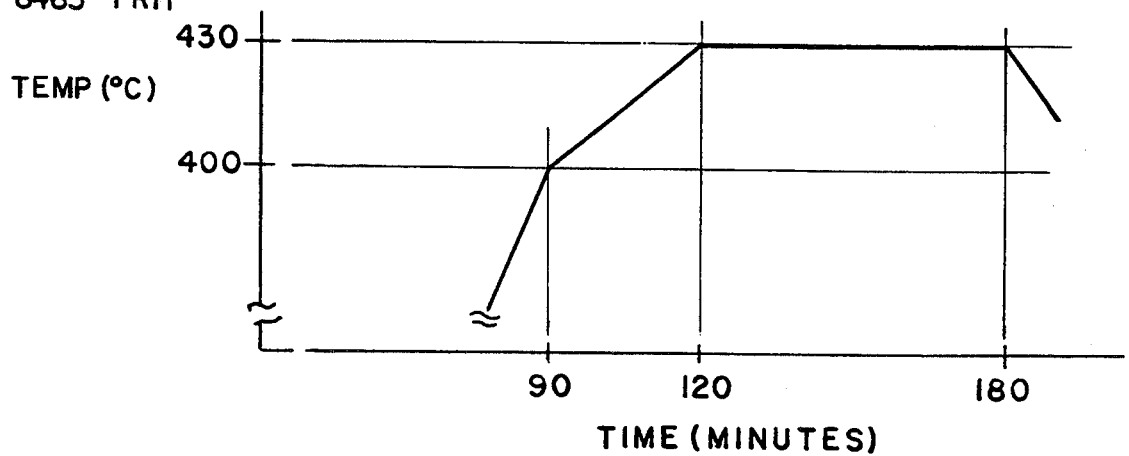

After the sealant material on the substrate cover 28 is dried, it is then heated in air within a chamber (not shown) at a temperature just above the softening point of the glass frit. This second heating cycle is used to "glaze" the glass frit on the substrate cover. That is, the glass frit powder is allowed to soften enough to cause the glass frit particles to flow together and to adhere to the substrate cover 28. Further, during this step, any additional remaining organic binder components in the glass frit are driven off. By providing the separate drying and glazing steps, it is believed that substantially all, if not all, of the binder vehicle components of the sealant material are driven off prior to final sealing of the cover 28 to the base 22. A glazing temperature profile such as shown in FIG. 6A for the devitrifying frit "7572" or a glazing temperature profile such as shown in FIG. 7A for the vitrifying frit "8463" is preferably used. For the vitrifying frit "8463", the general range for the glazing temperature is 380° C. to 435° C. The preferred temperature of 400° C. reduces the amount of bubbling and spread of the glass frit during the subsequent sealing operation. Similarly, for the devitrifying frit "7572"the temperature range for the glazing operation is from 340° C. to 380° C. At the preferred temperature of 360©the amount of bubbling of the glass frit material is reduced and the spread of the glass frit material is also reduced during the subsequent sealing operation. During the glazing operation, after the cover 28 has been held at the final temperature for the prescribed period of time, the heat source for the chamber is turned off and the cover 28 is allowed to cool to substantially room temperature before being removed from the chamber.

Referring now to FIGS. 4C, a packaged SAW resonator 20' is shown. The package for such a device and for similar types of SAW devices such as a delay line, filter, and the like are substantially the same except for the particular configuration of transducers and reflecting gratings as required. Therefore, fabrication of the package 20' for the resonator 21 will here be described, however, such fabrication procedure will equally apply to fabricating other types of packaged SAW devices.

The SAW device package 20' for the resonator 21a is shown to include in addition to the processed substrate cover 26 as described in conjunction with FIGS. 4A, 4B, the base substrate 22, here comprised of ST-cut quartz having a thickness here substantially equal to the thickness of the substrate cover 26, and having on a surface 22a a pair of transducers 24a, 24b and over surface 22b, transducers 34a, 34b. Each one of said transducers 34, 36 are comprised of interdigitated conductive members which are coupled to corresponding ones of bus bar members (not numbered), as shown. Bus bar members and interdigitated conductive members are fabricated as described above.

The substrate cover 28 having the glazed glass frit is mated to the substrate surface 22a to provide a seal 29 as shown in FIGS. 1A, 1B, and 3C. The glass frit seal 29 in addition to providing a hermetic seal for the packaged SAW device also serves the purpose of a spacer to provide a space 29a (FIG. 4C) between the opposing inner surfaces of the pair of substrates 22, 26. This space 29a permits the uninhibited propagation of surface waves along the surface 22a of base substrate 22.

Figure 6B:
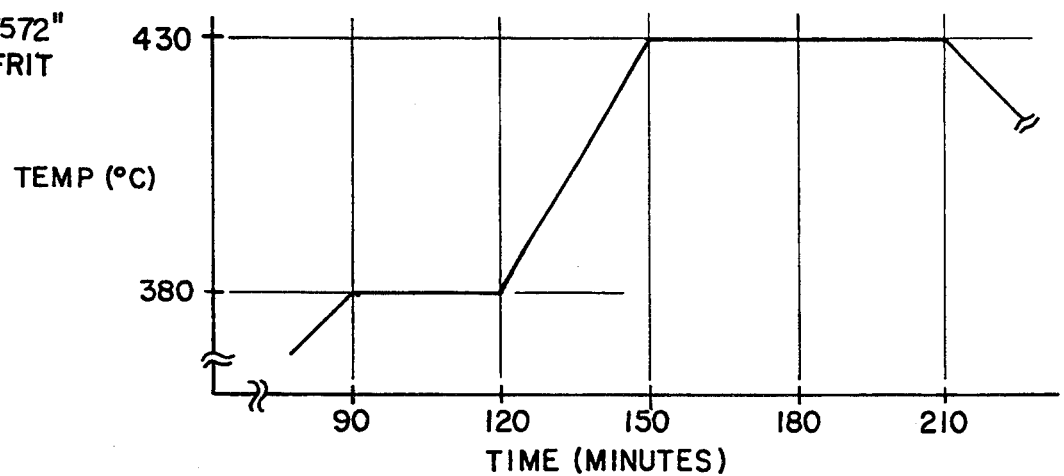

The substrate cover 28, having the patterned glazed glass frit as shown in FIG. 3C, is mated to surface 22a of substrate 22 in the following manner. The base 22 and cover 28, are mated together and are held in place by a suitable jig (not shown) which exerts a force to hold said members 22, 28 together. The entire assembly including the jig is then heated in a chamber which provides a vacuum of typically from 1 torr to $10^{-6}$ torr, at a temperature above the glazing temperature of the glass frit, but below the crystallographic transformation temperature of the material of the substrates in order to cause the glass frit to reflow and wet both the quartz cover 28 and the quartz substrate or base 22 and base 22 and cover 38. A sealing temperature profile such as shown in FIG. 5 for the devitrifying frit "7572" or as shown in FIG. 6 for the vitrifying frit "8463" may be used. A maximum sealing temperature in the range of 410° C. to 470° C. for the devitrifying frit "7572" is preferably used with 430° C. being the preferred temperature, and a maximum sealing temperature in the range of 410° C. to 470° C. for the vitrifying frit "8463" is preferably used with 430° C. being the preferred temperature.

An alternative sealing cycle is to heat the SAW device quickly up to a temperature just below the sealing temperature and hold it at that temperature for about 1 hour. This allows any additional impurities to be out gassed. After the hold cycle, the SAW device is then brought up to a temperature above the sealing temperature for a short period to seal the mated substrates. The time period above the sealing temperature is minimized so as to minimize bubbling of the glass frit.

During the sealing operation, after the resonator 21 has been held at the final temperature for the prescribed period, the heat source in the chamber is turned-off and the chamber is allowed to cool to near ambient temperature before removing the resonator 21.

At this point, the resonator 21 is provided as shown in FIGS. 1B. The resonator 21 as shown includes pairs of exposed bus bars, (not numbered), base substrate 22, glass frit seals and substrate covers 28, 38. Note that the width $W_{28}$ of substrate cover 28, is selected to be smaller than the width $W_{22}$ of the base substrate 22, such that the bus bars are exposed on surface of the base substrate 22.

For a device such as a delay line (not shown), the seal may be a non-rectangular pattern so that portions of the seal will not be perpendicular to the acoustic aperture of the device. With this arrangement, reflected surface waves will not interfere with the operation of the delay line.

Using the general techniques discussed above, to build a 350 MHz SAW resonator sealed in the all-quartz package, but without the Si-doped Al transducers provides SAW resonators having a resonant frequency which is shifted by about +45 ppm ±15 ppm. Thus, a rather large frequency shift with a rather large uncertainty in the frequency shift is provided which makes accurate reproduction at a particular design frequency difficult.

Six 402 MHz resonators were fabricated using the techniques described above including the use of Si-doped Al transducers having a concentration of Si after sealing of about 0.5%. After sealing these six 402 MHz SAW resonators, the sealing induced frequency shift was −2 ppm ±7.5 ppm. Thus, the use of Si-doped Al transducers on ST-cut quartz reduced the magnitude, as well as, the spread or uncertainty in sealing-induced resonator frequency shifts of those SAW resonators.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A SAW device comprising:
   a substrate comprising a piezoelectric material which supports surface wave propagation, said material comprising a piezoelectric ceramic having the chemical formula: $A_xB_{1-x}O$ where O is oxygen, A and B are metals, and x is the compositional ratio of A to O; and
   transducer means disposed on said substrate comprised of a conductive metal doped with a predetermined concentration of at least one of A and B.

2. The SAW device as recited in claim 1 wherein the dopant is provided to reduce shifts in frequency of the SAW device resulting from post thermal cycling of the SAW device.

3. The SAW device of claim 1 wherein the concentration of the dopant in said conductive material is at least 0.3%.

4. The device as recited in claim 1 further comprising:
means for enclosing said transducer, comprising a cover and a sealant disposed between the peripheral portions of said cover and corresponding peripheral portions of said substrate.

5. The device of claim 4 wherein the concentration of said dopant is in the range of about 0.5% to 1.0% with respect to said conductive material.

6. A SAW device comprising:
a substrate comprised of quartz having a surface which supports surface wave propagation; and
a pair of transducers, each disposed on said surface wave propagation surface, said transducers comprising a conductive metal doped with silicon having a concentration of silicon with respect to the metal of at least 0.3%.

7. The SAW device as recited in claim 6 wherein the conductive metal is aluminum.

8. The SAW device as recited in claim 7 wherein the dopant concentration of silicon is in the range of about 0.3% to 1.0%.

9. The SAW device as recited in claim 7 wherein the dopant concentration of silicon is about 0.5%.

10. The SAW device as recited in claim 6 further comprising:
means for enclosing said surface wave propagation surface.

11. The SAW device as recited in claim 10 wherein said means for enclosing said surface wave propagation surface includes a cover comprised of quartz and a glass frit disposed between peripheral surface portions of said cover and corresponding peripheral surface portions of said base.

12. The device as recited in claim 11 wherein the said cover and said substrate are each comprised of a matched ST-cut or rotated ST-cut of quartz.

* * * * *